US009583446B2

(12) United States Patent
Pagaila et al.

(10) Patent No.: US 9,583,446 B2
(45) Date of Patent: *Feb. 28, 2017

(54) SEMICONDUCTOR DEVICE AND METHOD OF FORMING A SHIELDING LAYER BETWEEN STACKED SEMICONDUCTOR DIE

(71) Applicant: STATS ChipPAC, Ltd., Singapore (SG)

(72) Inventors: Reza A. Pagaila, Tangerang (ID); Byung Tai Do, Singapore (SG); Nathapong Suthiwongsunthorn, Singapore (SG)

(73) Assignee: STATS ChipPAC Pte. Ltd., Singapore (SG)

( * ) Notice: Subject to any disclaimer, the term of this patent is extended or adjusted under 35 U.S.C. 154(b) by 37 days.

This patent is subject to a terminal disclaimer.

(21) Appl. No.: 14/553,358

(22) Filed: Nov. 25, 2014

(65) Prior Publication Data

US 2015/0115394 A1    Apr. 30, 2015

Related U.S. Application Data

(60) Continuation of application No. 13/691,440, filed on Nov. 30, 2012, now Pat. No. 8,907,498, which is a (Continued)

(51) Int. Cl.
*H01L 23/552*    (2006.01)
*H01L 21/56*    (2006.01)
(Continued)

(52) U.S. Cl.
CPC .......... *H01L 23/552* (2013.01); *H01L 21/568* (2013.01); *H01L 21/76898* (2013.01);
(Continued)

(58) Field of Classification Search
CPC ..... H01L 23/52; H01L 23/552; H01L 23/481; H01L 23/49816; H01L 23/5389; H01L 21/568; H01L 21/76898
(Continued)

(56) References Cited

U.S. PATENT DOCUMENTS 5,250,843 A    10/1993    Eichelberger
5,353,498 A    10/1994    Fillion et al.
(Continued)

*Primary Examiner* — Nathan W Ha
(74) *Attorney, Agent, or Firm* — Robert D. Atkins; Patent Law Group: Atkins and Associates, P.C.

(57) ABSTRACT

A semiconductor device has a first semiconductor die with a shielding layer formed over its back surface. The first semiconductor die is mounted to a carrier. A first insulating layer is formed over the shielding layer. A second semiconductor die is mounted over the first semiconductor die separated by the shielding layer and first insulating layer. A second insulating layer is deposited over the first and second semiconductor die. A first interconnect structure is formed over the second semiconductor die and second insulating layer. A second interconnect structure is formed over the first semiconductor die and second insulating layer. The shielding layer is electrically connected to a low-impedance ground point through a bond wire, RDL, or TSV. The second semiconductor die may also have a shielding layer formed on its back surface. The semiconductor die are bonded through the metal-to-metal shielding layers.

29 Claims, 8 Drawing Sheets

Related U.S. Application Data division of application No. 12/411,310, filed on Mar. 25, 2009, now Pat. No. 8,378,383.

(51) Int. Cl.
| | |
|---|---|
| *H01L 23/31* | (2006.01) |
| *H01L 23/498* | (2006.01) |
| *H01L 23/538* | (2006.01) |
| *H01L 25/065* | (2006.01) |
| *H01L 25/00* | (2006.01) |
| *H01L 21/768* | (2006.01) |
| *H01L 23/48* | (2006.01) |
| *H01L 23/50* | (2006.01) |
| *H01L 23/00* | (2006.01) |

(52) U.S. Cl.
CPC ........ *H01L 23/3128* (2013.01); *H01L 23/481* (2013.01); *H01L 23/49816* (2013.01); *H01L 23/49827* (2013.01); *H01L 23/50* (2013.01); *H01L 23/5389* (2013.01); *H01L 24/85* (2013.01); *H01L 25/0657* (2013.01); *H01L 25/50* (2013.01); *H01L 24/19* (2013.01); *H01L 24/48* (2013.01); *H01L 2224/0557* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/12105* (2013.01); *H01L 2224/16225* (2013.01); *H01L 2224/32145* (2013.01); *H01L 2224/32225* (2013.01); *H01L 2224/48091* (2013.01); *H01L 2224/73203* (2013.01); *H01L 2224/73204* (2013.01); *H01L 2224/73265* (2013.01); *H01L 2224/73267* (2013.01); *H01L 2224/85* (2013.01); *H01L 2225/06517* (2013.01); *H01L 2225/06527* (2013.01); *H01L 2924/00014* (2013.01); *H01L 2924/01004* (2013.01); *H01L 2924/01073* (2013.01); *H01L 2924/01074* (2013.01); *H01L 2924/01078* (2013.01); *H01L 2924/01079* (2013.01); *H01L 2924/01322* (2013.01); *H01L 2924/09701* (2013.01); *H01L 2924/12041* (2013.01); *H01L 2924/12042* (2013.01); *H01L 2924/13091* (2013.01); *H01L 2924/14* (2013.01); *H01L 2924/1433* (2013.01); *H01L 2924/181* (2013.01); *H01L 2924/19041* (2013.01); *H01L 2924/3011* (2013.01); *H01L 2924/3025* (2013.01); *H01L 2924/30105* (2013.01)

(58) Field of Classification Search
USPC .......................................... 257/686
See application file for complete search history.

(56) References Cited

U.S. PATENT DOCUMENTS

| | | |
|---|---|---|
| 5,841,193 A | 11/1998 | Eichelberger |
| 7,550,833 B2 | 6/2009 | Mihara |
| 7,550,857 B1 | 6/2009 | Longo et al. |
| 7,619,901 B2 | 11/2009 | Eichelberger et al. |
| 7,741,567 B2* | 6/2010 | Beddingfield .... H01L 23/49833 174/386 |
| 7,799,602 B2 | 9/2010 | Pagaila et al. |
| 7,838,337 B2 | 11/2010 | Marimuthu et al. |
| 7,842,542 B2 | 11/2010 | Shim et al. |
| 7,851,893 B2* | 12/2010 | Kim ...................... H01L 21/561 257/621 |
| 8,097,489 B2 | 1/2012 | Pagaila et al. |
| 8,102,032 B1* | 1/2012 | Bolognia ............ H01L 23/3128 257/659 |
| 8,198,716 B2* | 6/2012 | Periaman ................ H01L 24/73 257/686 |
| 8,218,323 B2 | 7/2012 | Choudhury et al. |
| 8,564,125 B2* | 10/2013 | Cho ..................... H01L 23/4334 257/713 |
| 8,674,482 B2 | 3/2014 | Shi et al. |
| 2006/0091517 A1* | 5/2006 | Yoo ........................ H01L 23/16 257/686 |
| 2006/0125072 A1 | 6/2006 | Mihara |
| 2007/0267725 A1 | 11/2007 | Lee et al. |
| 2008/0112150 A1 | 5/2008 | Jones |
| 2008/0246126 A1 | 10/2008 | Bowles et al. |
| 2008/0315374 A1 | 12/2008 | Kim et al. |
| 2010/0078771 A1 | 4/2010 | Barth et al. |
| 2010/0078776 A1 | 4/2010 | Barth et al. |
| 2010/0213585 A1 | 8/2010 | Usami |
| 2010/0244217 A1 | 9/2010 | Ha et al. |

* cited by examiner

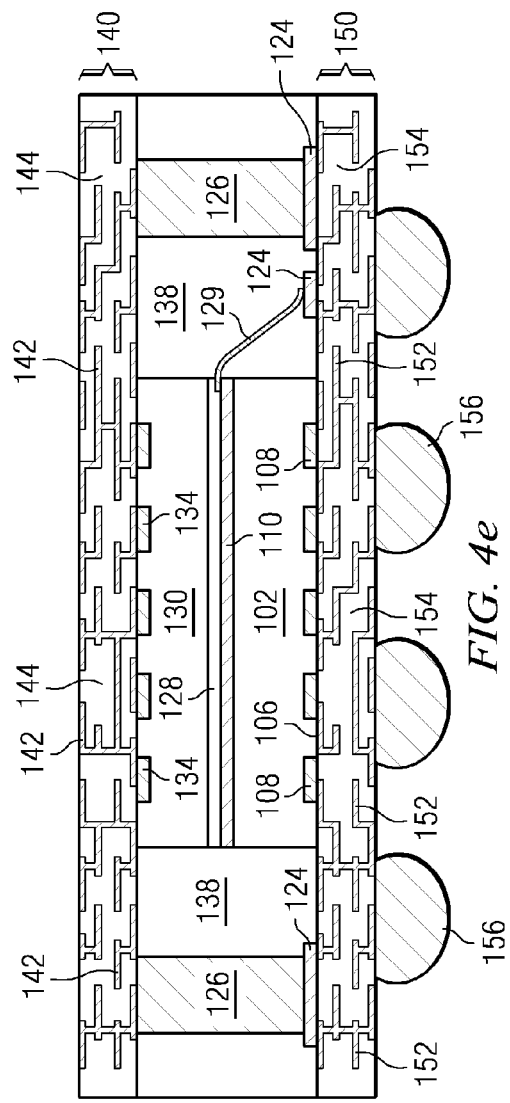
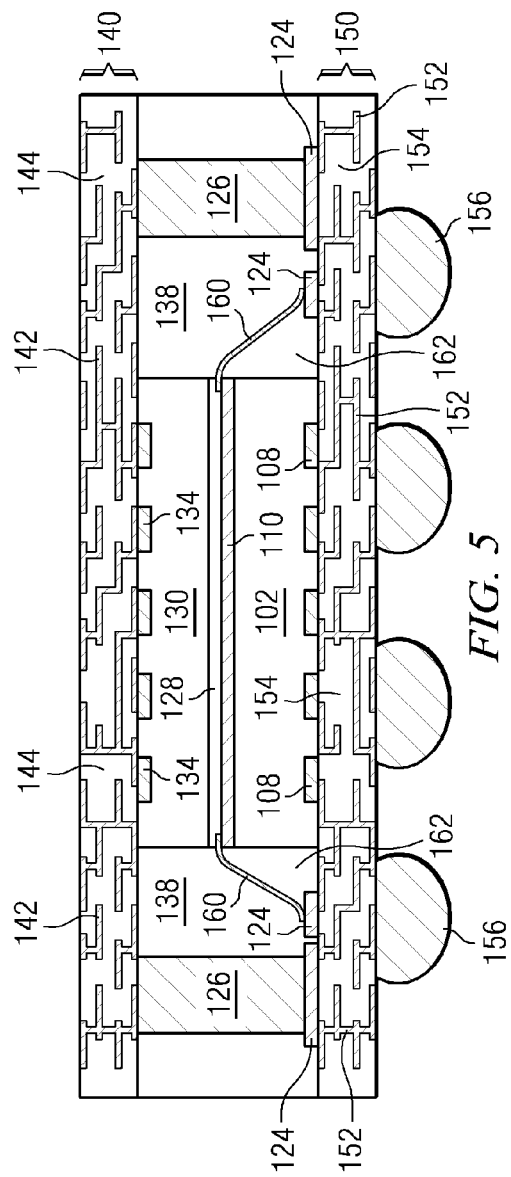

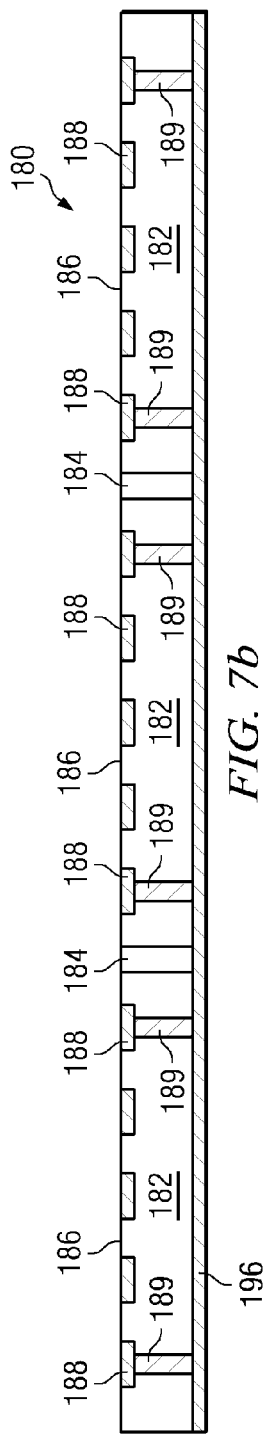

SEMICONDUCTOR DEVICE AND METHOD OF FORMING A SHIELDING LAYER BETWEEN STACKED SEMICONDUCTOR DIE

CLAIM TO DOMESTIC PRIORITY

The present application is a continuation of U.S. patent application Ser. No. 13/691,440, now U.S. Pat. No. 8,907,498, filed Nov. 30, 2012, which is a division of U.S. patent application Ser. No. 12/411,310, now U.S. Pat. No. 8,378,383, filed Mar. 25, 2009, which applications are incorporated herein by reference.

FIELD OF THE INVENTION

The present invention relates in general to semiconductor devices and, more particularly, to a semiconductor device and method of forming a shielding layer between stacked semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Another goal of semiconductor manufacturing is to produce higher performance semiconductor devices. Increases in device performance can be accomplished by forming active components that are capable of operating at higher speeds. In high frequency applications, such as radio frequency (RF) wireless communications, integrated passive devices (IPDs) are often contained within the semiconductor device. Examples of IPDs include resistors, capacitors, and inductors. A typical RF system requires multiple IPDs in one or more semiconductor packages to perform the necessary electrical functions. However, high frequency electrical devices generate or are susceptible to undesired electromagnetic interference (EMI) and radio frequency interference (RFI), or other inter-device interference, such as capacitive, inductive, or conductive coupling, also known as cross-talk, which can interfere with their operation.

To isolate the semiconductor devices from EMI and RFI, a shielding layer is typically disposed over the semiconductor device and connected to a ground plane, such as taught by U.S. Pat. No. 7,187,060 and US patent publications 20080246126 and 20070267725. For stacked semiconductor die, the shield is typically placed over the assembly. However, the shielding does not reduce interference between the stacked semiconductor die.

SUMMARY OF THE INVENTION

A need exists to shield between stacked semiconductor die from adverse effects of EMI, RFI, and other inter-device interference. Accordingly, in one embodiment, the present invention is a method of making a semiconductor device comprising the steps of providing a first semiconductor die, forming a shielding layer over the first semiconductor die, disposing a second semiconductor die over the shielding layer, and electrically connecting the shielding layer to a ground point.

In another embodiment, the present invention is a method of making a semiconductor device comprising the steps of providing a first semiconductor die, forming a shielding layer over the first semiconductor die, and disposing a second semiconductor die over the shielding layer.

In another embodiment, the present invention is a semiconductor device comprising a first semiconductor die. A shielding layer is formed over the first semiconductor die. A second semiconductor die is disposed over the shielding layer. A first interconnect structure is disposed over the first semiconductor die and electrically connected to the shielding layer.

In another embodiment, the present invention is a semiconductor device comprising a first semiconductor die. A shielding layer is formed over the first semiconductor die. A second semiconductor die is disposed over the shielding layer.

BRIEF DESCRIPTION OF THE DRAWINGS

FIGS. 4a-4e illustrate a process of stacking semiconductor die with a shielding layer disposed between the die;

FIG. 5 illustrates the stacked semiconductor die and shielding layer grounded through RDL;

FIGS. 7a-7d illustrate a process of stacking semiconductor die with double shielding layers disposed between the die.

DETAILED DESCRIPTION OF THE DRAWINGS

Figure 1:
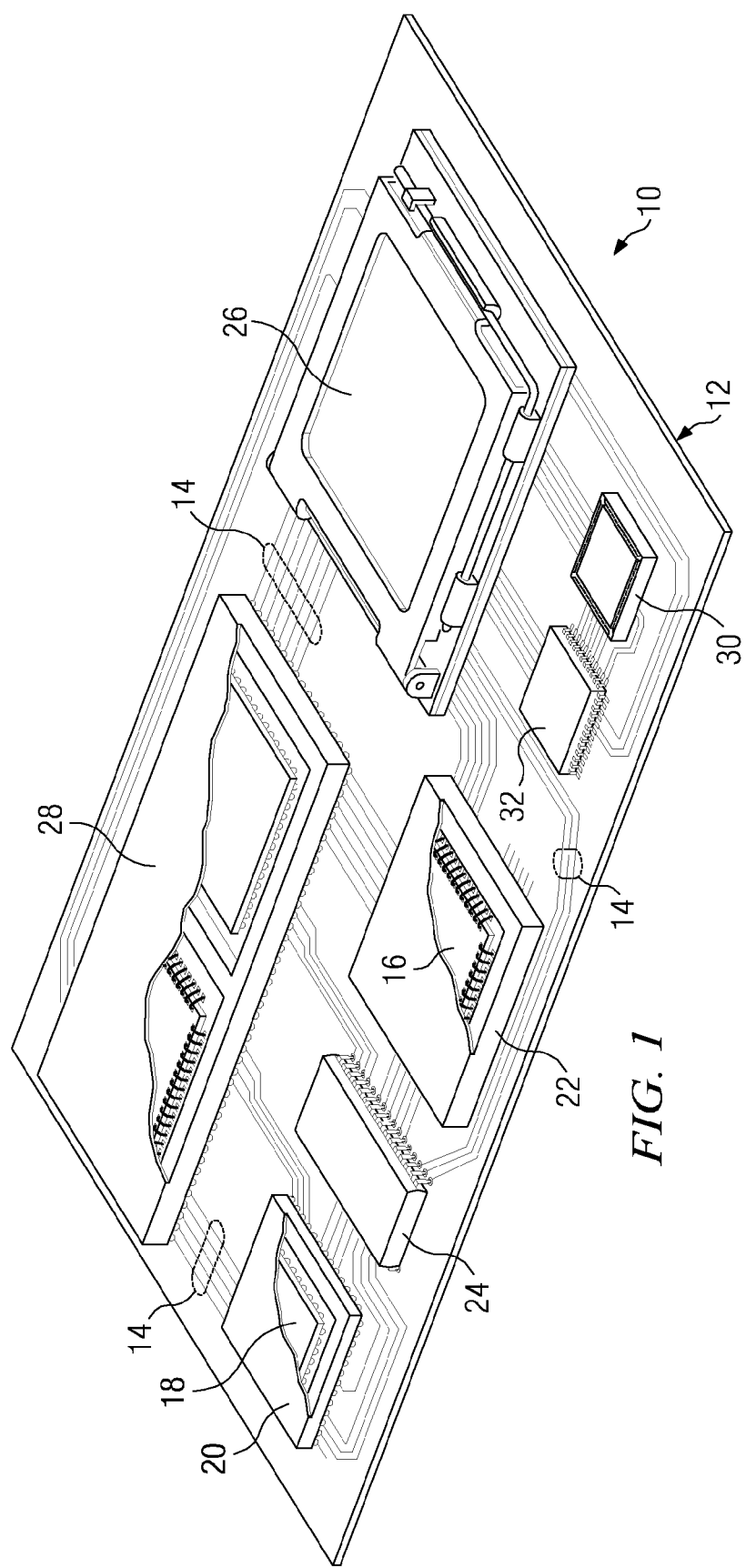
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the semiconductor material conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed over a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in lower costs for consumers.

Figure 2A:
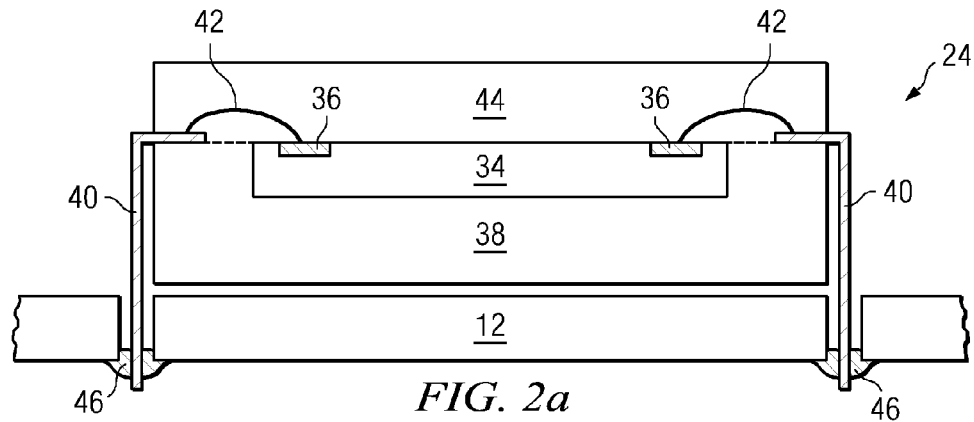
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
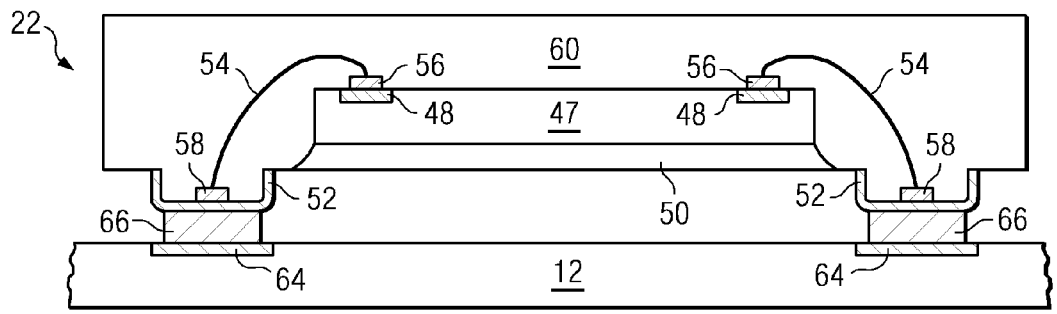

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed over a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
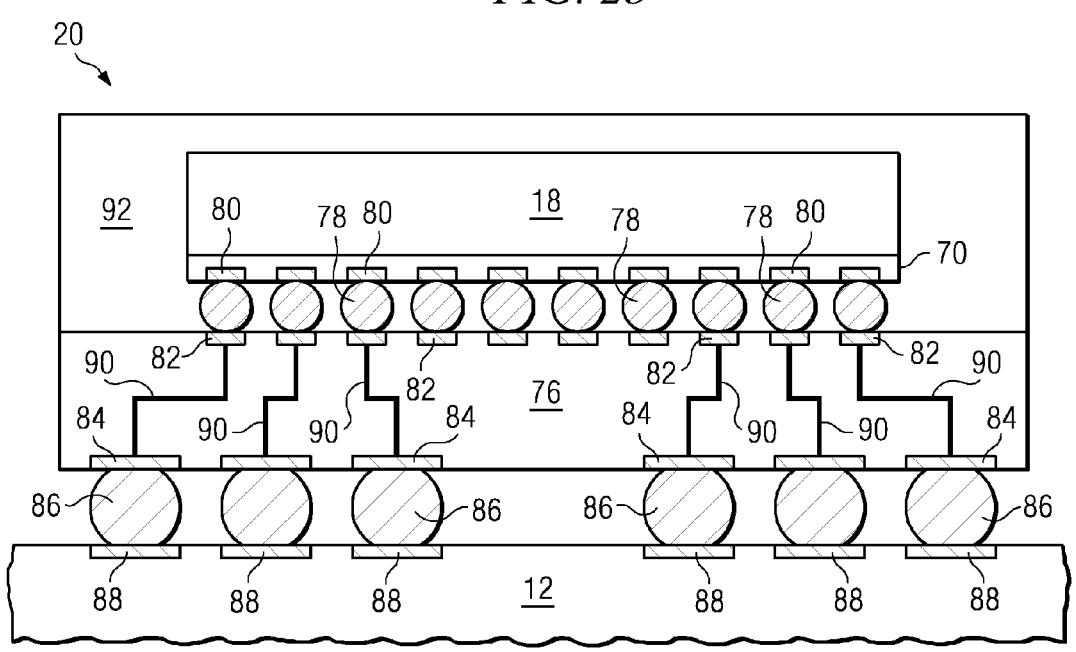

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed over bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed over bump pads or interconnect sites 84. The bump pads 84 are electrically connected to interconnect sites 82 through conductive lines 90 routed through carrier 76. Contact pads 88 are formed over a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and improve overall circuit performance. In another embodiment, the semiconductor die 18 can be mechanically and electrically attached directly to PCB 12 using flip chip style first level packaging without carrier 76.

Figure 3:
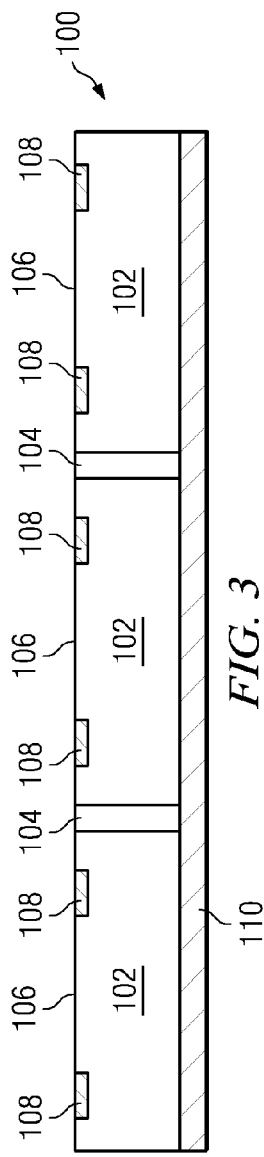
FIG. 3 illustrates a semiconductor wafer with a plurality of semiconductor die and back surface shielding layer.

FIG. 3 shows a semiconductor wafer 100 made with silicon, germanium, gallium arsenide, or other bulk semiconductor material. A plurality of semiconductor die 102 is formed over wafer 100 using the integrated circuit processes described above. Each semiconductor die 102 is separated by saw streets 104 and includes analog or digital circuits implemented as active and passive devices, conductive layers, and dielectric layers formed over topside active surface 106 and electrically interconnected according to the electrical design of the die. For example, the circuit may include one or more transistors, diodes, and other circuit elements formed within active surface 106 to implement baseband analog circuits or digital circuits, such as digital signal processor (DSP), memory, or other signal processing circuit. Semiconductor die 102 may also contain integrated passive devices (IPD), such as inductors, capacitors, and resistors, for radio frequency (RF) signal processing. Contact pads 108 electrically connect to active and passive devices and signal traces within active surface 106 of semiconductor die 102.

The IPDs in semiconductor die 102 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun dedicated for a frequency band of operation of the quad-band device.

A typical RF system requires multiple IPDs and other high frequency circuits in one or more semiconductor packages to perform the necessary electrical functions. The high frequency electrical devices generate or are susceptible to undesired electromagnetic interference (EMI) and radio frequency interference (RFI), or other inter-device interference, such as capacitive, inductive, or conductive coupling, also known as cross-talk.

To reduce EMI and RFI, an electrically conductive shielding layer 110 with an optional seed layer is deposited over a back surface of semiconductor wafer 100, opposite active surface 106. Shielding layer 110 can be Cu, Al, soft-magnetic materials such as ferrite or carbonyl iron, stainless steel, nickel silver, low-carbon steel, silicon-iron steel, foil, epoxy, conductive resin, and other metals and composites capable of blocking or absorbing EMI, RFI, and other inter-device interference. Alternatively, shielding layer 110 can be a dielectric material such as carbon-black or aluminum flake to reduce the effects of EMI and RFI. The seed layer can be made with Cu, Ni, nickel vanadium (NiV), Au, or Al. The seed layer and shielding layer 110 are patterned and deposited using an electrolytic plating, electroless plating, sputtering, PVD, CVD, or other suitable metal deposition process.

Semiconductor wafer 100 is singulated along saw streets 104 using a laser cutting device or saw blade into individual semiconductor die 102. Each semiconductor die 102 includes shielding layer 110 formed over the back surface of the die.

Figure 4A:
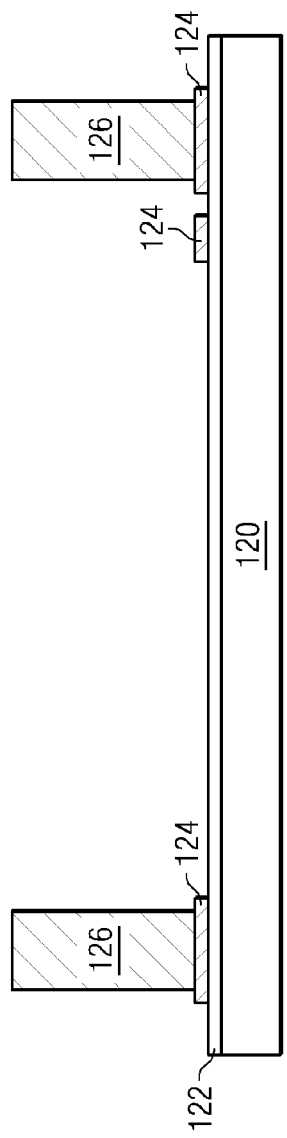

In FIG. 4a, a sacrificial substrate or carrier 120 contains dummy or sacrificial base material such as silicon, polymer, polymer composite, metal, ceramic, glass, glass epoxy, beryllium oxide, or other suitable low-cost, rigid material or bulk semiconductor material for structural support. An adhesive layer 122 is deposited on the surface of carrier 120. Adhesive layer 122 can be a flexible plastic base film, such as polyvinyl chloride (PVC) or polyolefin, with a synthetic acrylic adhesive, thermal sensitive, ultraviolet (UV)-sensitive adhesive, for device mounting and removal. Adhesive layer 122 is releasable by light, heat, laser, or mechanical pressure and can be cleaned off afterward. Adhesive layer 122 is deposited using spin coating, spray coating, or printing, and may include a laminated polymer adhesive or UV curable liquid adhesive. Alternatively, an adhesive material, such as thermal epoxy, polymer composite, or inorganic bonding compounds, can be applied to carrier 120.

An electrically conductive layer 124 is formed over adhesive layer 122 using a patterning and deposition process as individual portions or sections. Conductive layer 124 is formed using PVD, CVD, electrolytic plating, electroless plating process, or other suitable metal deposition process. Conductive layer 124 can be Al, Cu, Sn, Ni, Au, Ag, or other suitable electrically conductive material. The individual portions of conductive layer 126 can be electrically common or electrically isolated depending on the design and function of the semiconductor.

Conductive pillars or posts 126 are formed over conductive layer 124. To form conductive pillars 126, a photoresist layer is deposited over adhesive layer 122 and conductive layer 124. A portion of photoresist layer is exposed and removed by an etching development process. A conductive material is deposited in the removed portion of the photoresist. The conductive material can be Cu, Al, tungsten (W), Au, solder, or other suitable electrically conductive material. The photoresist is stripped away leaving behind individual conductive pillars 126. In another embodiment, conductive pillars 126 can be replaced with solder balls or stud bumps.

Figure 4B:
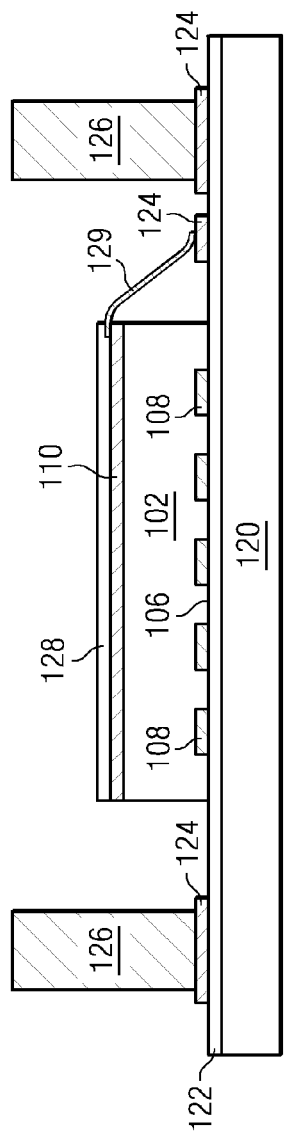

In FIG. 4b, semiconductor die 102 with backside shielding layer 110 is mounted to adhesive layer 122 between conductive pillars 126 with contact pads 108 oriented face down (shielding layer 110 facing upward). An insulating layer 128 is formed over shielding layer 110. The insulating layer 128 can be wire-on-film (WIF) material. The insulating layer 128 is deposited as single or multiple layers using spin coating, lamination, or taping. Shielding layer 110 is electrically connected to bond wire 129 which provides a conduction path to route interfering signals from the shielding layer to an external low-impedance ground point.

Figure 4C:
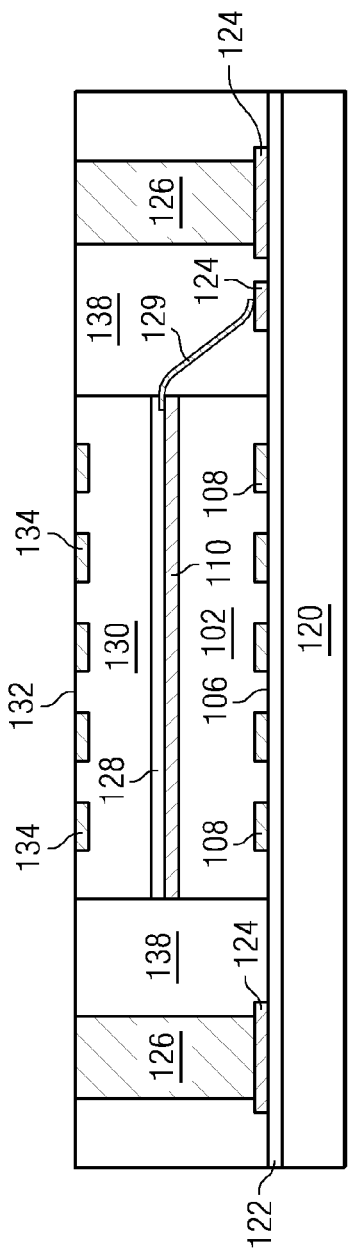

In FIG. 4c, a semiconductor die 130 is mounted to insulating layer 128. Semiconductor die 130 includes analog or digital circuits implemented as active and passive devices, IPD, conductive layers, and dielectric layers formed over active surface 132 and electrically interconnected according to the electrical design of the die. For example, the circuit may include one or more transistors, diodes, and other circuit elements formed within active surface 132 to implement baseband analog circuits or digital circuits, such as DSP, memory, or other signal processing circuit. Semiconductor die 130 may also contain IPD, such as inductors, capacitors, and resistors, for RF signal processing. Contact pads 134 electrically connect to active and passive devices and signal traces within active surface 132 of semiconductor die 130.

Semiconductor die 102 and 130 may generate or be susceptible to undesired EMI, RFI, or other inter-device interference. Shielding layer 110 provides a cost effective and simple approach to reducing the EMI, RFI, or other interference between semiconductor die 102 and 130.

An insulating layer 138 is deposited over the stacked semiconductor die 102 and 130 and around conductive pillars 126. The insulating layer 138 can be a thermosetting resin or photo-curable resin, such as epoxy resin, phenol resin, cyanate resin, fiberglass, fluorocarbon resin, poly (tetrafluoroethylene) (PTFE) resin, polyphenylene oxide (PPO) resin, or poly(phenylene ether) (PPE) resin. Alternatively, an encapsulant or molding compound is deposited over the stacked semiconductor die 102 and 130 and around conductive pillars 126 using a printing, compressive molding, transfer molding, liquid encapsulant molding, or other suitable applicator. The encapsulant can be epoxy resin, epoxy acrylate, polymer, or polymer composite material. The encapsulant is non-conductive and environmentally protects the semiconductor device from external elements and contaminants. Semiconductor die 102 and 130 are thus embedded within insulating layer 138.

Figure 4D:
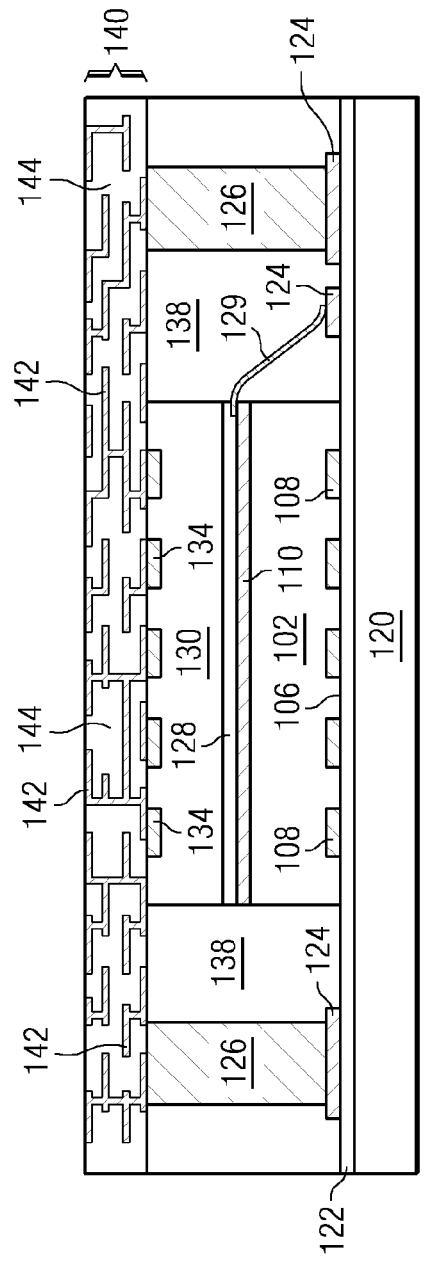

In FIG. 4d, a topside interconnect structure 140 is formed over insulating layer 138, conductive pillars 126, and semiconductor die 130. The interconnect structure 140 includes conductive layers and signal traces 142, which are separated by insulating layers 144. The insulating layers 144 can be silicon dioxide (SiO2), silicon nitride (Si3N4), silicon oxynitride (SiON), tantalum pentoxide (Ta2O5), zircon (ZrO2), aluminum oxide (Al2O3), or other suitable dielectric material. The insulating layers 144 are patterned or blanket deposited using PVD, CVD, printing, sintering, or thermal oxidation. Conductive layer 142 is formed using PVD, CVD, electrolytic plating, electroless plating process, or other suitable metal deposition process. Conductive layer 142 can be Al, Cu, Sn, Ni, Au, Ag, or other suitable electrically conductive material. The interconnect structure 140 is electrically connected to conductive pillars 126 and the active and passive devices within semiconductor die 102 and 130 to form functional electrical circuits according to the electrical design and function of the semiconductor die.

In FIG. 4e, carrier 120 and adhesive layer 122 are removed by chemical cleaning, chemical etching, mechanical peel-off, CMP, or mechanical grinding. A bottom-side interconnect structure 150 is formed over insulating layer 138, conductive layer 124, and semiconductor die 102. The interconnect structure 150 includes conductive layers and signal traces 152, which are separated by insulating layers 154. The insulating layers 154 can be SiO2, Si3N4, SiON, Ta2O5, ZrO2, Al2O3, or other suitable dielectric material. The insulating layers 154 are patterned or blanket deposited using PVD, CVD, printing, sintering, or thermal oxidation. Conductive layer 152 is formed using PVD, CVD, electrolytic plating, electroless plating process, or other suitable metal deposition process. Conductive layer 152 can be Al, Cu, Sn, Ni, Au, Ag, or other suitable electrically conductive material. The interconnect structure 150 is electrically connected to conductive pillars 126 and the active and passive devices within semiconductor die 102 and 130 to form functional electrical circuits according to the electrical design and function of the semiconductor die.

An electrically conductive solder material is deposited over conductive layer 152 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 156. In some applications, solder bumps 156 are reflowed a second time to improve electrical contact to conductive layer 152. Solder bumps 156 represent one type of interconnect structure that can be formed over conductive layer 152. The interconnect structure can also use bond wires, 3D interconnects, conductive paste, or other electrical interconnect.

In FIG. 5, shielding layer 110 is electrically connected to conductive layer 124 and interconnect structure 150 through redistribution layer (RDL) 160. RDL 160 and interconnect structure 150 provide a conduction path to route interfering signals from shielding layer 110 to an external low-impedance ground point. A dielectric layer 162 is formed between RDL 160 and interconnect structure 150.

Figure 6:
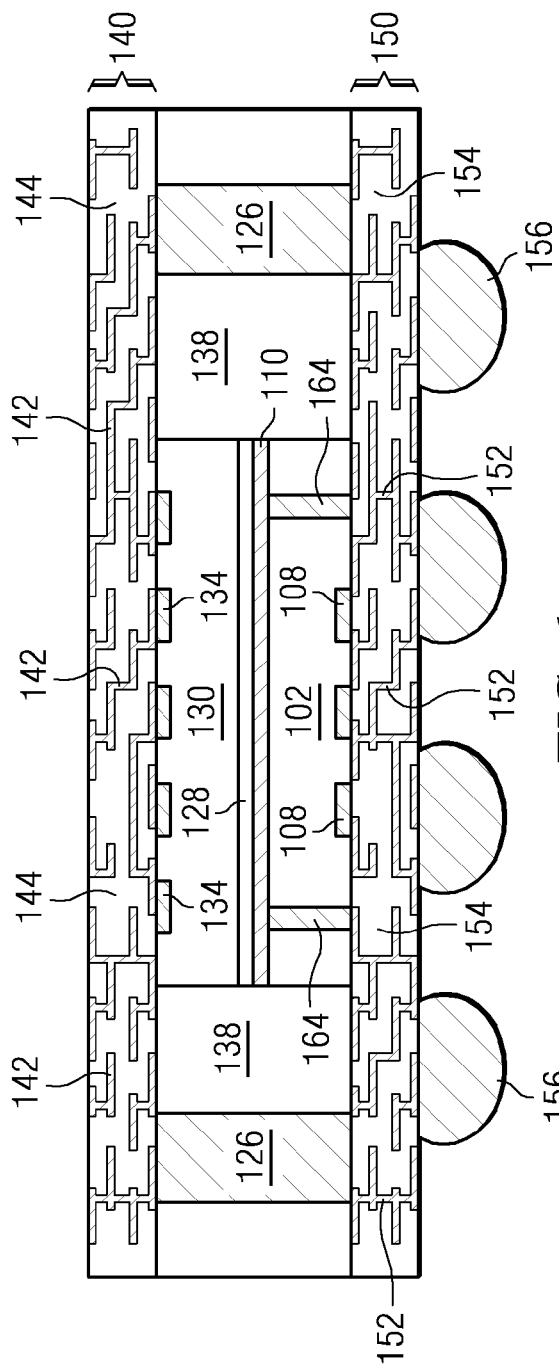
FIG. 6 illustrates the stacked semiconductor die and shielding layer grounded through TSV.

FIG. 6 shows through silicon vias (TSV) 164 which are formed through semiconductor die 102 by etching or drilling a via through the silicon material and filling the via with Al, Cu, Sn, Ni, Au, Ag, titanium (Ti), W, poly-silicon or other suitable electrically conductive material. Shielding layer 110 is electrically connected to interconnect structure 150 through TSV 164. TSV 164 and interconnect structure 150 provide a conduction path to route interfering signals from shielding layer 110 to an external low-impedance ground point.

Figure 7A:
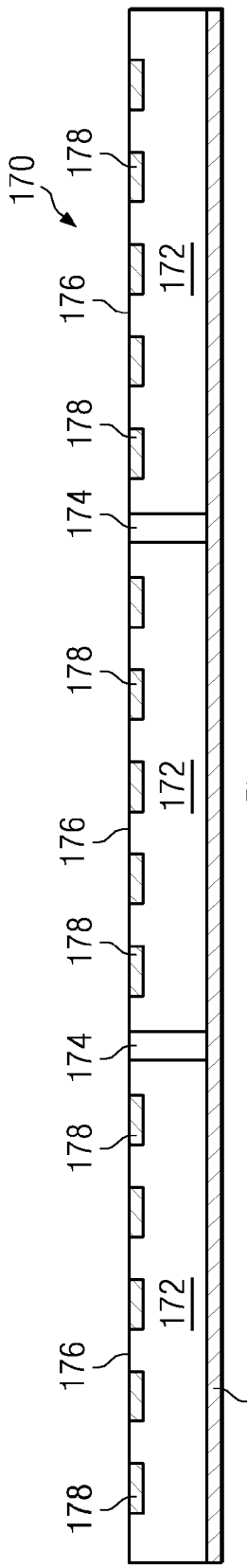

FIG. 7a shows a semiconductor wafer 170 made with silicon, germanium, gallium arsenide, or other bulk semiconductor material. A plurality of semiconductor die 172 is formed over wafer 170 using the integrated circuit processes described above. Each semiconductor die 172 is separated by saw streets 174 and includes analog or digital circuits implemented as active and passive devices, conductive layers, and dielectric layers formed over topside active surface 176 and electrically interconnected according to the electrical design of the die. For example, the circuit may include one or more transistors, diodes, and other circuit elements formed within active surface 176 to implement baseband analog circuits or digital circuits, such as DSP, memory, or other signal processing circuit. Semiconductor die 172 may also contain IPD, such as inductors, capacitors, and resistors, for RF signal processing. Contact pads 178 electrically connect to active and passive devices and signal traces within active surface 176 of semiconductor die 172.

In FIG. 7b, a semiconductor wafer 180 is made with silicon, germanium, gallium arsenide, or other bulk semiconductor material. A plurality of semiconductor die 182 is formed over wafer 180 using the integrated circuit processes described above. Each semiconductor die 182 is separated by saw streets 184 and includes analog or digital circuits implemented as active and passive devices, conductive layers, and dielectric layers formed over topside active surface 186 and electrically interconnected according to the electrical design of the die. For example, the circuit may include one or more transistors, diodes, and other circuit elements formed within active surface 186 to implement baseband analog circuits or digital circuits, such as DSP, memory, or other signal processing circuit. Semiconductor die 182 may also contain IPD, such as inductors, capacitors, and resistors, for RF signal processing. Contact pads 188 electrically connect to active and passive devices and signal traces within active surface 186 of semiconductor die 182. A TSV 189 is formed through semiconductor die 182 by etching or drilling a via through the silicon material and filling the via with Al, Cu, Sn, Ni, Au, Ag, Ti, W, or other suitable electrically conductive material.

The IPDs in semiconductor die 172 and 182 provide the electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other GSM communications, each balun dedicated for a frequency band of operation of the quad-band device. A typical RF system requires multiple IPDs and other high frequency circuits in one or more semiconductor packages to perform the necessary electrical functions. The high frequency electrical devices generate or are susceptible to undesired EMI, RFI, or other inter-device interference, such as capacitive, inductive, or conductive coupling, also known as cross-talk.

To reduce EMI and RFI, an electrically conductive shielding layer 190 with an optional seed layer is deposited over a back surface of semiconductor wafer 170, opposite active surface 176. Likewise, an electrically conductive shielding layer 196 with an optional seed layer is deposited over a back surface of semiconductor wafer 180, opposite active surface 186. Shielding layers 190 and 196 Cu, Al, soft-magnetic materials such as ferrite or carbonyl iron, stainless steel, nickel silver, low-carbon steel, silicon-iron steel, foil, epoxy, conductive resin, and other metals and composites capable of blocking or absorbing EMI, RFI, and other interference. Alternatively, shielding layers 190 and 196 can be a dielectric material such as carbon-black or aluminum flake to reduce the effects of EMI and RFI. The seed layer can be made with Cu, Ni, NiV, Au, or Al. The seed layer and shielding layers 190 and 196 are patterned and conformally deposited using an electrolytic plating, electroless plating, sputtering, PVD, CVD, or other suitable metal deposition process.

In FIG. 7c, semiconductor wafers 170 and 180 are bonded together by shielding layers 190 and 196. The metal-to-metal bonding between shielding layers 190 and 196 eliminates the need for adhesive between the die which saves manufacturing cost. The wafer-level bonding is cost effective and increases manufacturing throughput.

In FIG. 7d, semiconductor wafers 170 and 180 are singulated along saw streets 174 and 184 using a laser cutting device or saw blade 199 into metal-to-metal bonded semiconductor die 172 and 182. Each bonded set of stacked semiconductor die 172 and 182 includes double shielding layers 190 and 196 disposed between the die. Semiconductor die 172 and 182 generate or are susceptible to undesired EMI, RFI, or other inter-device interference. The double shielding layers 190 and 196 reduce the EMI, RFI, or other interference between semiconductor die 172 and 182.

Figure 8:
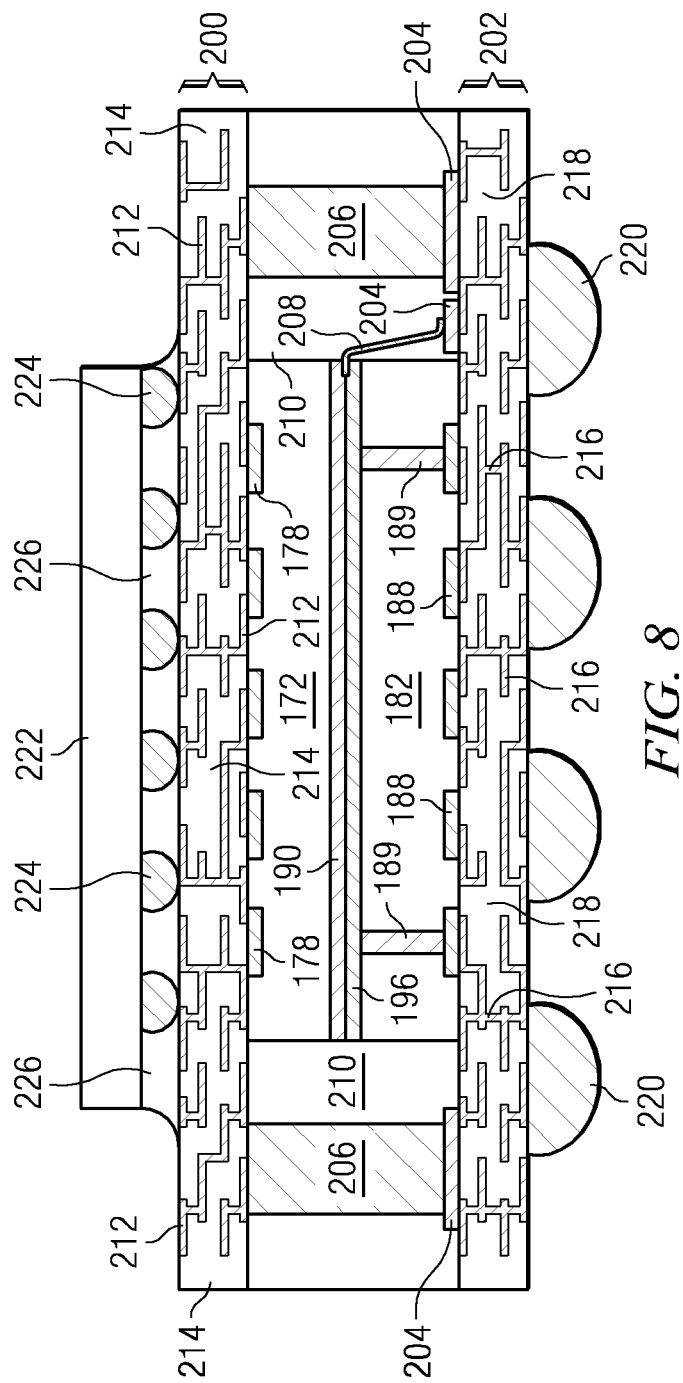
FIG. 8 illustrates the stacked semiconductor die and double shielding layers.

FIG. 8 shows topside interconnect structure 200 and bottom-side interconnect structure 202 formed over bonded semiconductor die 172 and 182. To form interconnect structures 200 and 202, a sacrificial substrate or carrier is provided that contains dummy or sacrificial base material such as silicon, polymer, polymer composite, metal, ceramic, glass, glass epoxy, beryllium oxide, or other suitable low-cost, rigid material or bulk semiconductor material for structural support. An adhesive layer is deposited on the surface of the carrier, similar to FIG. 4a.

An electrically conductive layer 204 is formed over the adhesive layer using a patterning and deposition process as individual portions or sections, similar to FIG. 4b. Conductive layer 204 is formed using PVD, CVD, electrolytic plating, electroless plating process, or other suitable metal deposition process. Conductive layer 204 can be Al, Cu, Sn, Ni, Au, Ag, or other suitable electrically conductive material. The individual portions of conductive layer 204 can be electrically common or electrically isolated depending on the design and function of the semiconductor.

Conductive pillars or posts 206 are formed over conductive layer 204. To form conductive pillars 206, a photoresist layer is deposited over the adhesive layer and conductive layer 204. A portion of photoresist layer is exposed and removed by an etching development process. A conductive material is deposited in the removed portion of the photoresist. The conductive material can be Cu, Al, W, Au, solder, or other suitable electrically conductive material. The photoresist is stripped away leaving behind individual conductive pillars 206. In another embodiment, conductive pillars 206 can be replaced with solder balls or stud bumps.

The bonded semiconductor die 172 and 182 are mounted to the adhesive layer between conductive pillars 206. Shielding layers 190 and 196 electrically connect to conductive layer 204 with bond wire 208. Shielding layers 190 and 196 can also be electrically connected to conductive layer 204 with an RDL. Bond wire 208 and later-formed interconnect structure 202 provide a conduction path to route interfering signals from shielding layer 190 and 196 to an external low-impedance ground point.

An insulating layer 210 is deposited over the stacked semiconductor die 172 and 182 and around conductive pillars 206. The insulating layer 210 can be a thermosetting resin or photo-curable resin, such as epoxy resin, phenol resin, cyanate resin, fiberglass, fluorocarbon resin, PTFE resin, PPO resin, or PPE resin. Alternatively, an encapsulant or molding compound is deposited over the stacked semiconductor die 172 and 182 and around conductive pillars 206 using a printing, compressive molding, transfer molding, liquid encapsulant molding, or other suitable applicator. The encapsulant can be epoxy resin, epoxy acrylate, polymer, or polymer composite material. The encapsulant is non-conductive and environmentally protects the semiconductor device from external elements and contaminants. Semiconductor die 172 and 182 are thus embedded within insulating layer 210.

The topside interconnect structure 200 is formed over insulating layer 210, conductive pillars 206, and semiconductor die 172. The interconnect structure 200 includes conductive layers and signal traces 212, which are separated by insulating layers 214. The insulating layers 214 can be SiO2, Si3N4, SiON, Ta2O5, ZrO2, Al2O3, or other suitable dielectric material. The insulating layers 214 are patterned or blanket deposited using PVD, CVD, printing, sintering, or thermal oxidation. Conductive layer 212 is formed using PVD, CVD, electrolytic plating, electroless plating process, or other suitable metal deposition process. Conductive layer 212 can be Al, Cu, Sn, Ni, Au, Ag, or other suitable electrically conductive material. The interconnect structure 200 is electrically connected to conductive pillars 206 and the active and passive devices within semiconductor die 172 and 182 to form functional electrical circuits according to the electrical design and function of the semiconductor die.

The carrier and adhesive layer are removed by chemical etching, mechanical peel-off, CMP, or mechanical grinding. The bottom-side interconnect structure 202 is formed over insulating layer 210, conductive layer 204, and semiconductor die 182. The interconnect structure 202 includes conductive layers and signal traces 216, which are separated by insulating layers 218. The insulating layers 218 can be SiO2, Si3N4, SiON, Ta2O5, ZrO2, Al2O3, or other suitable dielectric material. The insulating layers 218 are patterned or blanket deposited using PVD, CVD, printing, sintering, or thermal oxidation. Conductive layer 216 can be Al, Cu, Sn, Ni, Au, Ag, or other suitable electrically conductive material. Conductive layer 216 is formed using PVD, CVD, electrolytic plating, electroless plating process, or other suitable metal deposition process. The interconnect structure 202 is electrically connected to conductive pillars 206 and the active and passive devices within semiconductor die 172 and 182 to form functional electrical circuits according to the electrical design and function of the semiconductor die.

An electrically conductive solder material is deposited over conductive layer 216 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 220. In some applications, solder bumps 220 are reflowed a second time to improve electrical contact to conductive layer 216. Solder bumps 220 represent one type of interconnect structure that can be formed over conductive layer 216. The interconnect structure can also use bond wires, 3D interconnects, conductive paste, or other electrical interconnect.

The double shielding layers 190 and 196 reduce the EMI, RFI, or other interference between semiconductor die 172 and 182. Shielding layer 196 is electrically connected through TSV 189, contact pads 188, conductive layer 204, and interconnect structure 202 to a low-impedance ground point.

Additional semiconductor devices can be mounted to interconnect structures 200 and 202. For example, semiconductor die 222 is mounted to interconnect structures 200 with solder bumps 224. An underfill material 226, such as epoxy, polymeric material, film, or other non-conductive material, is deposited under semiconductor die 222. Semiconductor die 222 is electrically connected to semiconductor die 172 and 182 through solder bumps 224, interconnect structures 200 and 202, and conductive pillars 206.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a first semiconductor die;
   forming a shielding layer over the first semiconductor die;
   providing a bond wire electrically connected between the shielding layer and a ground point; and
   disposing a second semiconductor die over the shielding layer with the bond wire disposed between the first semiconductor die and second semiconductor die.

2. The method of claim 1, further including forming a first interconnect structure over the first semiconductor die.

3. The method of claim 2, further including forming a second interconnect structure over the second semiconductor die opposite the first interconnect structure.

4. The method of claim 3, further including forming a conductive pillar between the first interconnect structure and second interconnect structure.

5. The method of claim 2, further including forming the bond wire electrically connected between the shielding layer and first interconnect structure.

6. The method of claim 1, further including forming a conductive via through the first semiconductor die.

7. A method of making a semiconductor device, comprising:
   providing a first semiconductor die;
   forming a shielding layer over the first semiconductor die;
   disposing a second semiconductor die over the shielding layer; and
   depositing an encapsulant around the first semiconductor die and second semiconductor die with a contact pad of the first semiconductor die and a contact pad of the second semiconductor die exposed from the encapsulant.

8. The method of claim 7, further including forming a first interconnect structure over the encapsulant and electrically connected to the shielding layer.

9. The method of claim 8, further including forming a second interconnect structure over the encapsulant opposite the first interconnect structure.

10. The method of claim 9, further including forming a conductive pillar between the first interconnect structure and second interconnect structure.

11. The method of claim 7, further including forming a bond wire between the shielding layer and first interconnect structure.

12. The method of claim 7, further including forming a conductive via through the first semiconductor die.

13. The method of claim 7, further including forming an insulating layer between the first semiconductor die and second semiconductor die.

14. A semiconductor device, comprising:
    a first semiconductor die;
    a shielding layer formed over the first semiconductor die;
    a second semiconductor die disposed over the shielding layer;
    an encapsulant deposited over the first semiconductor die and second semiconductor die;
    a first interconnect structure disposed over the first semiconductor die and electrically connected to the shielding layer; and
    a second interconnect structure disposed over the encapsulant opposite the first interconnect structure.

15. The semiconductor device of claim 14, further including a conductive pillar disposed between the first interconnect structure and second interconnect structure.

16. The semiconductor device of claim 14, further including a bond wired disposed between the first semiconductor die and second semiconductor die to electrically connect the shielding layer to the first interconnect structure.

17. The semiconductor device of claim 14, further including a conductive via formed through the first semiconductor die to electrically connect the shielding layer to the first interconnect structure.

18. The semiconductor device of claim 16, further including an insulating layer disposed between the first semiconductor die and second semiconductor die with the bond wire extending into the insulating layer.

19. A semiconductor device, comprising:
a first semiconductor die;
a ground point;
a shielding layer formed over the first semiconductor die;
a bond wire electrically connected between the shielding layer and ground point; and
a second semiconductor die disposed over the shielding layer with the bond wire disposed between the first semiconductor die and second semiconductor die.

20. The semiconductor device of claim 19, further including a first interconnect structure formed over the first semiconductor die, wherein the first interconnect structure includes the ground point.

21. The semiconductor device of claim 20, further including a second interconnect structure formed over the second semiconductor die opposite the first interconnect structure.

22. The semiconductor device of claim 19, further including a conductive via formed through the first semiconductor die.

23. The semiconductor device of claim 19, further including an insulating layer disposed between the first semiconductor die and second semiconductor die with a portion of the bond wire extending through the insulating layer.

24. A semiconductor device, comprising:
a first semiconductor die;
a shielding layer formed over the first semiconductor die;
a second semiconductor die disposed over the shielding layer; and
an encapsulant deposited around the first semiconductor die and second semiconductor die with a contact pad of the first semiconductor die and a contact pad of the second semiconductor die exposed from the encapsulant.

25. The semiconductor device of claim 24, further including a first interconnect structure formed over the first semiconductor die and encapsulant.

26. The semiconductor device of claim 25, further including a second interconnect structure formed over the second semiconductor die and encapsulant opposite the first interconnect structure.

27. The semiconductor device of claim 25, further including a bond wire formed between the shielding layer and first interconnect structure.

28. The semiconductor device of claim 24, further including a conductive via formed through the first semiconductor die to the shielding layer.

29. The semiconductor device of claim 24, further including an insulating layer disposed between the first semiconductor die and second semiconductor die.

* * * * *